DIODE-INDUCTOR COUPLING FOR CASCADED TRANSISTOR STAGES

Original Filed May 3, 1957

INVENTOR.
J. J. EACHUS
BY Henry L. Hanson
ATTORNEY

United States Patent Office 3,056,042
Patented Sept. 25, 1962

3,056,042
DIODE-INDUCTOR COUPLING FOR CASCADED TRANSISTOR STAGES

Joseph J. Eachus, Cambridge, Mass., assignor to Minneapolis-Honeywell Regulator Company, Minneapolis, Minn., a corporation of Delaware
Original application May 3, 1957, Ser. No. 656,791. Divided and this application Mar. 24, 1961, Ser. No. 98,222
4 Claims. (Cl. 307—88.5)

Figure 1:
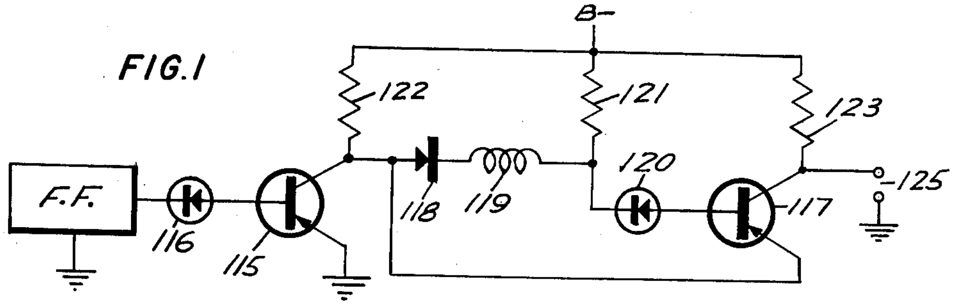

This application is a division of an application entitled, "Electrical Pulse Circuits," Serial Number 656,791, filed May 3, 1957 and assigned to the assignee of the present application.

The present invention relates in general to new and improved pulse-forming circuits, and in particular to new and improved apparatus for handling, shaping and transferring digital data.

Prior art circuits of the type described herein have frequently been characterized by a lack of flexibility and a lack of adaptability for use in the logical design and implementation of digital data handling circuits. This property has limited the field of application of each circuit, thereby raising the cost of the entire system of which the circuit is a part. Moreover, prior art circuits have been relatively complex in nature with the attendant problems of reliability and maintenance costs.

It is an object of the present invention to provide improved pulse-shaping apparatus which overcomes the foregoing disadvantages.

It is another object of the present invention to provide a pulse-shaping apparatus which is flexible in its application and which is readily adapted for use in digital data processing equipment.

It is a further object of the present invention to provide a simple and economical pulse-forming circuit which is characterized by its improved output waveform characteristics.

It is yet another object of the present invention to provide improved apparatus for reliably generating a pulse signal output from a bilevel signal driving source.

In a copending application of the present inventor entitled, "Electrical Signal Gating Apparatus," Serial Number 614,839, filed October 9, 1956, now Patent No. 2,986,652, there is disclosed a new type of gating and switching circuit. This circuit employs a pair of semiconductor devices connected in a signal-controlling configuration, said devices having different levels of conduction. In a preferred form, these semiconductor devices comprise a germanium diode and a silicon diode respectively, so arranged in a circuit that, if the germanium diode is conducting current, a potential point in the circuit to which the silicon diode is connected will have a voltage thereon which is less than the voltage necessary to exceed the conducting threshold of the silicon diode. As a consequence, there will be no signal on the output of the circuit. Conversely, the silicon diode is so arranged that if the germanium diode is not conducting, the potential point to which the silicon diode is connected will have a voltage thereon which is above its conducting threshold to cause a signal to appear on the output of the circuit.

In many applications, it is desirable to produce an output signal which occurs in synchronism with an applied input signal, the latter having been operated upon so as to alter its polarity and duration. For example, the output signal of a flip-flop circuit is generally in the form of a D.C. step signal. As such, it is frequently desirable to modify it to provide an output pulse. In the present invention, this is accomplished by the use of a differentiating circuit which makes use of the principles set forth in the abovementioned copending application. More specifically, the desired output pulse waveform is obtained by the use of silicon diode-germanium diode circuitry, along with a suitable time delay circuit, to control the conduction of a transistorized amplifier. Dissimilar semiconductor devices having an impedance connected in series therewith to control the output pulse shape and pulse width are employed in the circuit.

The various features of the invention are pointed out with particularity in the claims annexed to and forming a part of the present specification. For a better understanding of the invention, its advantages and specific objects attained with its use, reference should be had to the accompanying drawings and descriptive matter in which there is illustrated and described a preferred embodiment of the invention.

Figure 2:
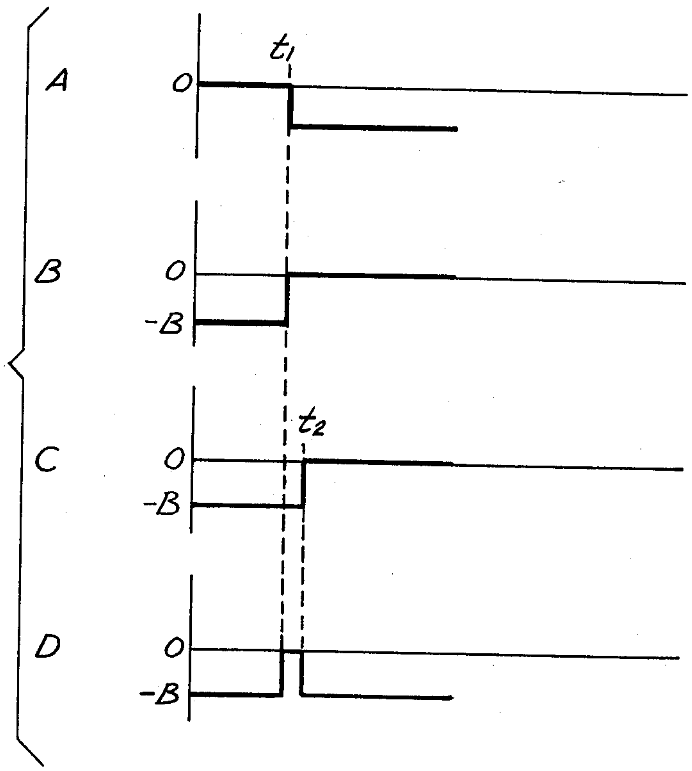

Of the drawings:

FIGURE 1 is a schematic showing of a preferred form of the present invention; and FIGURE 2 illustrates pertinent waveforms associated with the operation of the circuit of FIGURE 1.

Referring now to the drawings, FIGURE 1 illustrates a circuit having a flip-flop coupled to the base electrode of an input transistor 115 by means of an input diode 116. A germanium diode 118 has its anode coupled to the collector electrode of transistor 115, the emitter electrode of the latter being coupled to ground. An inductor is connected between the cathode of the diode 118 and a silicon diode 120. The anode of the diode 120 is coupled to the base electrode of a transistor 117. A resistor 121 is coupled between a negative power supply terminal B— and the junction point which connects the inductor 119 and the diode 120. A load resistor 122 is connected between the collector electrode of the transistor 115 and the B— source. Another load resistor 123 is coupled between the collector electrode of the transistor 117 and the B— source. The emitter of the transistor 117 is directly connected to the collector of the transistor 115. The output signal is derived across a pair of terminals 125 connected to the collector of transistor 117 and ground respectively.

In considering the operation of FIGURE 1, it is important to note that each individual signal at the time of switching normally takes the form of a direct current step as illustrated in FIGURES 2A and 2B. It is assumed herein that the waveform present on the input of the diode 116 is as illustrated in FIGURE 2A, i.e. a signal having zero amplitude until time $t_1$ when the signal suddenly goes negative. With zero potential on the base electrode of transistor 115, the collector electrode on the lower end of the resistor 122 will have a negative potential thereon which is substantially equal to the negative B— potential of the circuit. As soon as the negative potential is applied to the base of the transistor 115, the latter will become conductive and, due to the low conductive impedance of the transistor, this action effectively grounds the lower terminal of resistor 122.

When the transistor 115 becomes conductive, it establishes a current flow path for the transistor 117 to enable the latter to conduct. The conductive circuit, thus established, may be traced from the ground terminal through the emitter-collector circuit of transistor 115, the emitter-collector circuit of transistor 117 and the load resistor 123 to the B— terminal. Since the transistors 115 and 117 have substantially zero internal impedance when conducting in saturation, the output terminals 125 will have substantially zero potential thereacross. Thus, the output voltage is suddenly changed from the B— potential on the lower terminal of resistor 123 to ground. This is illustrated in FIGURE 2D and is seen to occur at time $t_1$. The ground potential on the lower end of the resistor 122 is further applied to the germanium diode 118, the latter being a part of a coupling circuit which further includes inductor 119 and silicon diode 120. After a time delay which is a function of the value of the inductor 119 and the resistor 121, the potential on the lower end of the latter falls below the point sufficient to sustain conduction of the silicon diode 120. When the latter is cut off, transistor 117 can no longer conduct, thereby effectively grounding its base electrode. This causes its collector electrode to return to the B— level.

The potential applied to the base of transistor 117 is illustrated in FIGURE 2C and is seen to reach the cutoff threshold of diode 120 at time $t_2$. Consequently, with the signal reflected through the transistor 117, the output pulse on the output terminals 125 will appear as illustrated in FIGURE 2D.

It will be apparent that the pulse produced may be considered to be the differentiated result of the applied square wave input signal. The output pulse on terminals 125 may be used in any desired manner for controlling further switching functions in other bistable circuits.

From the foregoing discussion, it will be seen that the invention herein is capable of providing a single output pulse in response to a bilevel signal applied to the input thereof. This is accomplished by the use of a unique coupling circuit employing dissimilar diodes and associated time delay circuitry. It will be further apparent that the invention readily lends itself for use in numerous applications for logical circuits in addition to the preferred embodiment which is illustrated in FIGURE 1. These applications may well be in the fields of communication, data processing, data reduction and the like.

The invention is not limited to the preferred embodiment illustrated, but is susceptible to changes to suit the requirements of different applications. For example, the invention is not limited to the use of a flip-flop circuit as an input source, but may utilize any bilevel input signal. Similar equivalents, such as the substitution of n-p-n transistors for the p-n-p transistors shown, with a consequent polarity reversal will be readily apparent to those skilled in the art.

While in accordance with the provisions of the statutes, there has been illustrated and described the best form of the invention known, it will be apparent to those skilled in the art that changes may be made in the form of the apparatus as disclosed without departing from the spirit of the invention as set forth in the appended claims, and that in some cases certain features of the invention may be used to advantage without a corresponding use of other features.

Having now described the invention, what is claimed as new and for which it is desired to secure Letters Patent is:

1. An output circuit for a bistable circuit having a step voltage output comprising a pair of transistors, means coupling an output electrode of one of said transistors to an input electrode of the other, said coupling means comprising a pair of diodes connected in series, an inductor connected in said series circuit, and a resistor connected to said series circuit between said diodes, said resistor being adapted for connection to a biasing voltage source.

2. An output circuit for a circuit having a step voltage output signal, comprising a pair of transistors, means coupling an output electrode of one of said transistors to an input electrode of the other, said coupling means comprising a pair of diodes having dissimilar conducting thresholds connected in series, an inductor connected in said series circuit, and a resistor connected to said series circuit between said diodes, said resistor being adapted for connection to a biasing voltage source so that when said step voltage appears, a single output pulse will appear on an output electrode of the other of said transistors.

3. An output circuit for a bistable circuit having a step voltage output comprising a pair of transistors, means coupling an output electrode of one of said transistors to an input electrode of the other, said coupling means comprising a pair of diodes having dissimilar conducting characteristics connected in series, an inductor connected in said series circuit, a resistor connected to said series circuit between said diodes, said resistor being adapted for connection to a biasing voltage source, and means coupling an output electrode of the other of said transistors to said output electrode of said one transistor.

4. A signal differentiation circuit comprising a pair of transistors, means coupling an output electrode of one of said transistors to an input electrode of the other, said coupling means comprising a pair of diodes connected in series, an inductor connected in said series circuit, and a resistor connected to said series circuit between said diodes, said resistor being adapted for connection to a biasing voltage source.

No references cited.